United States Patent
Yao et al.

(10) Patent No.: US 8,601,429 B1
(45) Date of Patent: Dec. 3, 2013

(54) METHOD FOR CONNECTING FLIP CHIP COMPONENTS

(75) Inventors: Tao Yao, San Jose, CA (US); Phil Tu, Cupertino, CA (US); Jaejoo Cho, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 255 days.

(21) Appl. No.: 13/007,586

(22) Filed: Jan. 14, 2011

Related U.S. Application Data

(62) Division of application No. 11/366,112, filed on Mar. 1, 2006, now Pat. No. 7,871,831.

(51) Int. Cl.
*G06F 17/50* (2006.01)
*H01L 21/66* (2006.01)
*G01R 31/26* (2006.01)

(52) U.S. Cl.
USPC ........... 716/137; 716/126; 716/129; 716/130; 438/14

(58) Field of Classification Search
USPC ..................... 716/126, 129, 130, 137; 438/14
See application file for complete search history.

(56) References Cited

U.S. PATENT DOCUMENTS

| | | | |
|---|---|---|---|
| 5,633,785 A * | 5/1997 | Parker et al. | 361/766 |
| 5,677,847 A | 10/1997 | Walling | |
| 6,111,317 A * | 8/2000 | Okada et al. | 257/737 |
| 6,144,091 A | 11/2000 | Washida | |
| 6,245,599 B1 | 6/2001 | Goto et al. | |
| 6,269,327 B1 | 7/2001 | Bednar et al. | |
| 6,295,634 B1 | 9/2001 | Matsumoto | |
| 6,319,752 B1 * | 11/2001 | Tain et al. | 438/110 |
| 6,400,019 B1 | 6/2002 | Hirashima et al. | |

(Continued)

OTHER PUBLICATIONS

Shuenn-Shi Chen et al., "An Even Wiring Approach to the Ball Grid Array Package Routing" Oct. 1999, Proceedings of the 1999 IEEE International Conference on Computer design, pp. 303-306.

(Continued)

*Primary Examiner* — Vuthe Siek
(74) *Attorney, Agent, or Firm* — Vista IP Law Group, LLP

(57) ABSTRACT

An automated system and method for determining flip chip connections involves generating a first projection that includes representations of bumps arranged over a core of the flip chip and generating a second projection that includes representations of I/O pads arranged around the core. The first projection is generated by drawing a line through each bump between a location of the flip chip and an outer portion of the flip chip and marking a location where the line terminates at the outer portion with a representation of the bump. The outer portion of the flip chip is traversed, and the first projection is generated based on the order in which bump representations are encountered. The second projection is generated by drawing a line through each I/O pad between a location of the flip chip and an outer portion of the flip chip and marking a location where the line terminates at the outer portion with a representation of the I/O pad. The outer portion of the flip chip is traversed, and the second projection is generated based on the order in which I/O pad representations are encountered. Connections between bump and I/O representations are made and connecting between bumps and I/O pads determined based on the connections between bump and I/O pad representations of respective first and second projections. The determined connections can be adjusted according to a hierarchy of bump representations to reduce or eliminate congestion, e.g., by changing a sequence of or deleting bump representations.

23 Claims, 20 Drawing Sheets

(56) References Cited

U.S. PATENT DOCUMENTS

| | | |
|---|---|---|
| 6,490,713 B2 | 12/2002 | Matsumoto |
| 6,499,134 B1 | 12/2002 | Buffet et al. |
| 6,510,544 B1 * | 1/2003 | Matsumoto et al. .......... 716/129 |
| 6,516,447 B2 | 2/2003 | Wadland et al. |
| 6,521,846 B1 | 2/2003 | Freda et al. |
| 6,586,825 B1 | 7/2003 | Rajagopalan et al. |
| 6,594,811 B2 | 7/2003 | Katz |
| 6,596,549 B2 | 7/2003 | Kitamura et al. |
| 6,976,236 B1 | 12/2005 | Tain et al. |
| 7,275,229 B2 | 9/2007 | Bittner et al. |
| 7,284,222 B1 | 10/2007 | Rohe et al. |
| 7,480,885 B2 | 1/2009 | Frankle et al. |
| 7,496,878 B2 | 2/2009 | Kitamura et al. |
| 2001/0039644 A1 | 11/2001 | Le Coz |
| 2004/0098690 A1 * | 5/2004 | Joseph et al. .................. 716/12 |
| 2004/0124545 A1 | 7/2004 | Wang |
| 2005/0109535 A1 | 5/2005 | Audet et al. |

OTHER PUBLICATIONS

Yao et al., "Package Aware Flip Chip Design Technology", Cadence Technical Conference Proceedings, May 2008.

Fang et al., "A Routing Algorithm for Flip Chip Design", IEEE/ACM International Conference on Computer-Aided Design, 2005, ICCAD-2005, p. 753-758.

Titus et al., "Innovative Circuit Board Level Routing Designs for BGA Packages," IEEE Trans. on Advanced Packaging, vol. 27, No. 4, Nov. 2004.

Liao et al., "Boundary Single-Layer Routing with Movable Terminals," IEEE Trans. of Computer-Aided Design, vol. 10, No. 11, Nov. 1991.

Hsu, "General River Routing Algorithm," 20th Design Automation Conference, 1983, p. 573-578.

* cited by examiner

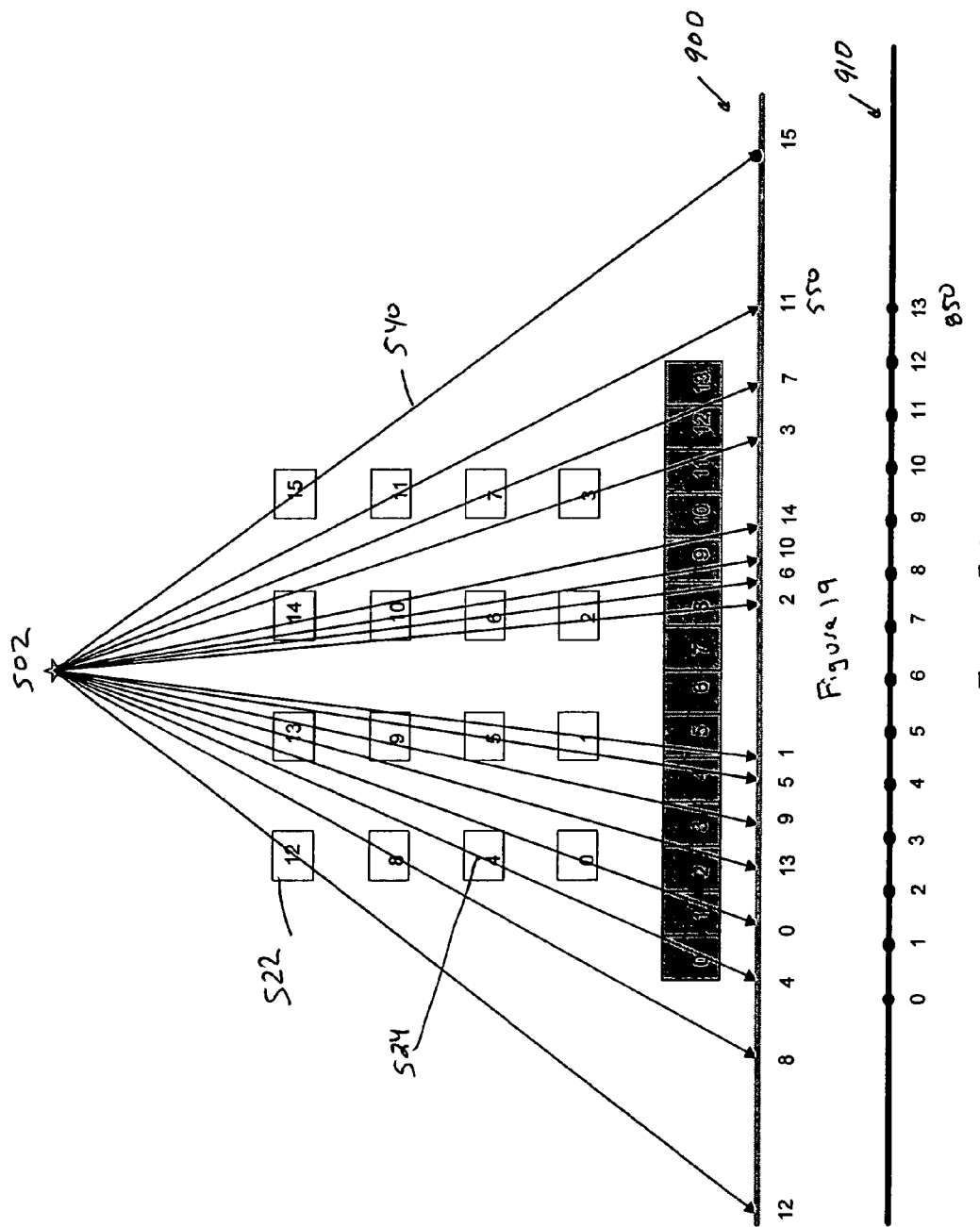

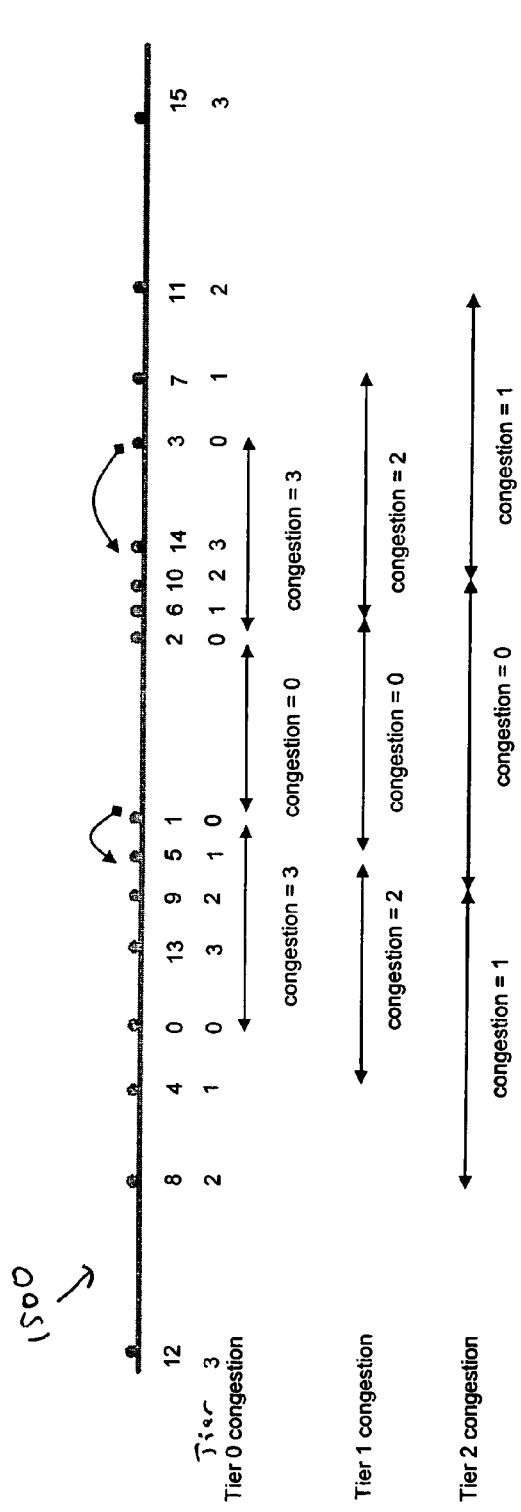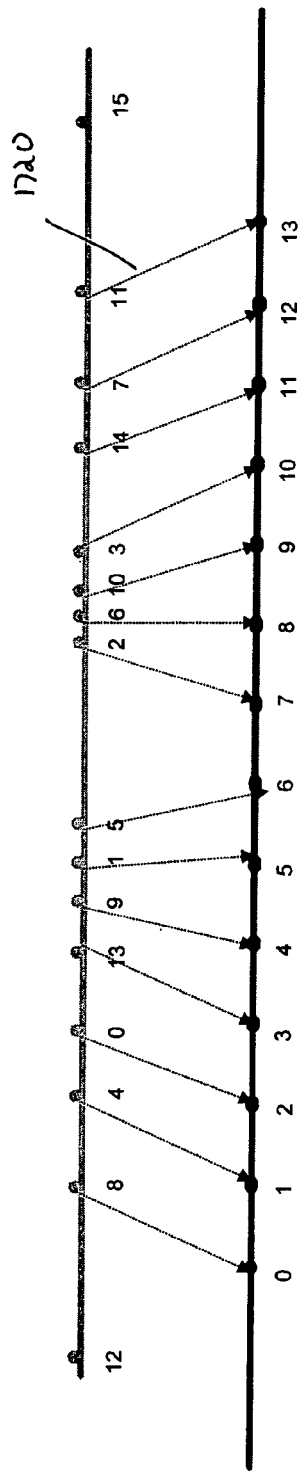
Figure 21
Figure 22

METHOD FOR CONNECTING FLIP CHIP COMPONENTS

CROSS-REFERENCE TO RELATED APPLICATIONS

The present application is a divisional of U.S. application Ser. No. 11/366,112, now U.S. Pat. No. 7,871,831, filed on Mar. 1, 2006, entitled "Method for Connecting Flip Chip Components," which is hereby incorporated by reference in its entirety for all purposes.

FIELD OF THE INVENTION

The invention relates generally to circuit design, and more particularly, to methods for automatically determining bump—I/O pad flip chip connections.

BACKGROUND

As designers strive to improve power, speed, and other Integrated Circuit (IC) capabilities, the number of input output (I/O) terminals that is used to connect ICs has also increased. Flip chip technology has become increasingly popular to provide improved connection capabilities.

Referring to FIG. 1, a flip chip 10 is a type of IC that does not require wire bonds. Instead, the chip 10 includes an array of bumps 12 over the core 13 of the chip and is placed on a substrate 14 with corresponding bonding pads 16. Solder beads are deposited on the bonding pads 16, and the chip 10 is mounted upside down in or on the substrate 14. The chip 10 and the substrate 14 are connected to each other after solder reflow. Underfill material is usually used to fill gaps between the chip 10 and the substrate 14.

Flip chip 10 design can be generally categorized as "package driven" or "chip driven" designs in package driven designs, a bump array is created, and the net associated to each bump is fixed. In chip driven design, I/O cells are either placed, or need to be placed, with constraints, and bump nets are assigned accordingly.

Referring to FIG. 2, one common flip-chip design is a peripheral I/O chip 20. In this design, an array 25 of bumps 22 located over the core area 24 of the chip 20. Input/Output (I/O) driver cells or I/O pads 26 (generally "pads") for corresponding nets are located in I/O rows or legal locations for pad placement around the core 24. Connections 28 between bumps 22 and I/O pads 26 are made 28 using a redistribution layer (RDL) router. An I/O pad 26 that is connected to a bump 22 is illustrated as being a shaded I/O pad or rectangle 26, whereas an I/O pad or rectangle 26 that is not connected to a bump 22 is not shaded. An unshaded rectangle represents a legal site in which a pad can be assigned to an I/O row, but is currently vacant. Routing resources are typically limited to a single RDL layer. Consequently, placement of I/O pads 26 and assignment of nets to bumps 22 become critical since it may not be permissible to route connections 28 through multiple routing layers. Although known methods of making flip chip connections have been effective to send degree, they can be improved.

For example, referring to FIG. 3, placement may result in crossing 30 of connections 28 between a bump 22 and an I/O pad 26. Further, placement may result in congestion 32, or too many connections in one area, e.g. too many connections 28 between adjacent bumps 22. Consequently, a router may not have the required resources to complete the circuit connections. Further challenges involve creating the bump array 25 and assigning bumps 22 to corresponding nets, placing I/O pads 26 around the core 24 with respect to various placement constraints, and routing bumps 22 to I/O pads 26 while using only a single redistribution layer (RDL) through which the connections 28 between bumps 22 and pads 26 must be made. Routing problems can be even more complicated when working with large numbers of two-pin nets.

One known method of making flip chip connections is to manually assign nets, place pads and draw wires using design editors. Manual approaches, however, are labor intensive and time consuming. For example, a chip having 600-800 bumps can require at least one week for a skilled designer to place pads with possible constraints, assign bump nets, and manually perform routing layout. Designers sometimes have to settle for a less than optimum solution due to the large number of nets and long turnaround time. Further, designers may be required to use more than one layer to complete routing. These shortcomings limit the applicability and usefulness of manual methods.

Other known methods use design tools, such as CIOP, available from Cadence Design Systems, 2655 Seely Avenue, San Jose, Calif. 95134. These tools are improvements over manual methods, but have a number of shortcomings. For example, these tools involve manual editing for placement, bump net assignment and generation of a placement file. A user performs bump assignment and pad placement by writing the desired location/assignment into a spreadsheet file. CIOP reads in the spreadsheet file or circuit design, and a separate router is employed to complete routing. Thus, while CIOP and other tools have been successfully used in the past, they are semi-automatic and lack automated bump assignment and pad placement functionality. Instead, a user must create a test file to tell the tool the location of each bump/I/O pad, and to which net each bump should be connected. If the particular assignment creates crossing or congestion, the tool cannot automatically correct these errors. Rather, a user must manually modify the original design. Thus, known design tools are essentially manual placement tools with an automatic router and require substantial user input. Additionally, some known tools are based on a PCB design tool and lack functions that are important in IC design, such as snapping to manufacturing grid and wire splitting, e.g., to accommodate the max wire width rule.

Accordingly, there exists a need for a system and method that can manage bump assignment, pad placement and routing, while being able to adapt to different design styles, such as fixed bumps, fixed pads, irregular bump array, and multiple I/O rows. There is also a need for a system and method that can perform these functions within a single redistribution layer. There is also a need for an integrated system that includes all of this functionality.

Embodiments of the invention fulfill these unmet needs.

SUMMARY

According to one embodiment, a method for determining flip chip connections includes generating first and second projections. The first projection includes representations of bumps arranged over a core of the flip chip, and the second projection includes representations of I/O pads arranged around the core. The method also includes determining connections between bumps and I/O pads based on connections between bump and I/O pad representations of respective first and second projections.

According to another embodiment, a method for determining flip chip connections includes generating first and second projections, the first projection having representations of fixed bumps arranged over a core of the flip chip and the second projection having representations of I/O pads arranged around the core. The method also includes determining connections between fixed bumps and I/O pads based on representations of respective first and second projections so that no fixed bump—I/O pad connection crosses another fixed bump—I/O pad connection.

According to a further alternative embodiment, a method for determining flip chip connections includes generating first and second projections. The first projection includes representations of bumps arranged over a core of the flip chip and is generated by drawing a line through the bump between a pre-determined location of the flip chip and an outer portion of the flip chip, and marking a location where the line terminates at the outer portion with a representation of the bump. After each bump representation is marked, the outer portion is traversed, and the first projection is generated based on the order in which bump representations are encountered. These steps are performed for each bump. The second projection is includes representations of I/O pads that are arranged around the core and is generated by drawing a line through the I/O pad between a pre-determined location and an outer portion of the flip chip, and
marking a location where the line terminates at the outer portion with a representation of the I/O pad. After each I/O pad representation is marked; the outer portion is traversed, and the second projection is generated based on the order in which I/O pad representations are encountered. These steps are performed for each I/O pad. Connections between bumps and I/O pads are determined based on bump and I/O pad representations of respective first and second projections.

In accordance with an additional alternative embodiment, a method for determining flip chip connections includes generating a first projection that includes representations of bumps arranged over a core of the flip chip and generating, generating a second projection that includes representations of I/O pads arranged around the core, and determining connections between bumps and I/O pads based on bump and I/O pad representations of respective first and second projections. The first projection is generated by drawing a line through the bump between a pre-determined location of the flip chip and an outer portion of the flip chip and marking a location where the line terminates at the outer portion with a representation of the bump. After each bump representation is marked, the outer portion is traversed, and the first projection is generated based on the order in which bump representations are encountered. These steps are preformed for each bump. The second projection is generated by drawing a line through the I/O pad between a pre-determined location and an outer portion of the flip chip and marking a location where the line terminates at the outer portion with a representation of the I/O pad. After each I/O pad representation is marked, the outer portion is traversed and the second projection is generated based on the order in which I/O pad representations are encountered. These steps are performed fro each I/O pad. The method also includes determining connections between bumps and I/O pads based on bump and I/O pad representations of respective first and second projections.

Another embodiment is directed to a method for determining flip chip connections by generating a first projection, generating a second projection, determining connections between bumps and I/O pads based on bump and I/O pad representations of respective first and second projections, assigning bump representations to a hierarchy that includes a plurality of levels and determining whether any determined bump—I/O pad connection should be adjusted based on the hierarchy. The hierarchy analysis includes, in the first projection, identifying higher-level bump representations that are located between first and second lower-level bump representations, and determining whether the number of identified higher-level bump representations exceeds a pre-determined number. If the number of identified higher-level bump representations exceeds the pre-determined number, the first projection and the determined connections between bumps and I/O pads using the adjusted first projection are adjusted.

In various embodiments, the first projection can include a non-sequential order of bump representations and be linear. The bump representations can be letters, symbols and/or numbers. The second projection can include a sequential order of I/O pad representations and can also be linear. The I/O pad representations can be letters, symbols and/or numbers.

Further, in various embodiments, connections between bumps and I/O pads are such that only one bump is connected to only one I/O pad. Additionally, connections can be such that no bump—I/O pad connection crosses another bump—I/O pad connection. Connections can advantageously be completed within a single redistribution layer.

Various embodiments can also utilize a hierarchical system in order to determine bump—I/O pad connections. In these embodiments, bump representations are assigned to a hierarchy that includes a plurality of levels, such as a bottom-up and inside-out hierarchies. At least one bump representation is assigned to a level. A determination is made whether any determined bump—I/O pad connection should be adjusted based on the hierarchy. For example, higher-level bump representations that are located between first and second lower-level bump representations are identified in the first projection. A determination is made whether the number of identified higher-level bump representations exceeds a pre-determined number. If so, then the first projection and the determined connections between bumps and I/O pads are adjusted, e.g., by changing a sequence of bump representations and/or deleting certain bump representations in the first projection so that the number of higher level bump representations between the first and second lower level bump representations in the adjusted first projection is less than or equal to the pre-determined number.

BRIEF DESCRIPTION OF THE DRAWINGS

Referring now to the drawings, in which like reference numbers represent corresponding parts throughout, and in which:

FIG. 19 illustrates projection lines drawn through bumps to generate a projection of bump representations;

FIG. 20 illustrates a projection of I/O pad representations resulting from drawing projection lines through I/O pads;

FIG. 21 illustrates a hierarchical analysis of a projection of I/O pad representations according to one embodiment;

FIG. 22 illustrates an adjusted projection following a hierarchical analysis and connections between bump representations and fixed I/O pad representations based on an adjusted projection.

DETAILED DESCRIPTION OF ILLUSTRATED EMBODIMENTS

Embodiments of the invention provide an integrated and automatic circuit design tool and method that can manage placement of I/O pads around a core, assignment of bumps on a chip and perform routing between bumps and pads. Embodiments eliminate crossing connections between bumps and I/O pads and reduce or eliminate congestion and can be used when I/O pads are to be assigned to fixed bumps, and when bumps are to be assigned to fixed I/O pads. These advantages are achieved without requiring a user to manually assign bump—I/O pad connections. Further, the connections can advantageously be implemented within a single RDL layer. These advantages are achieved by projecting bump array and I/O sequences, and making connections between bump and I/O pad representations of the projections, and implementing bump—I/O pad connections based on the projection connections. Aspects of embodiments are described in further detail below and shown in FIGS. 4-23.

Figure 1:
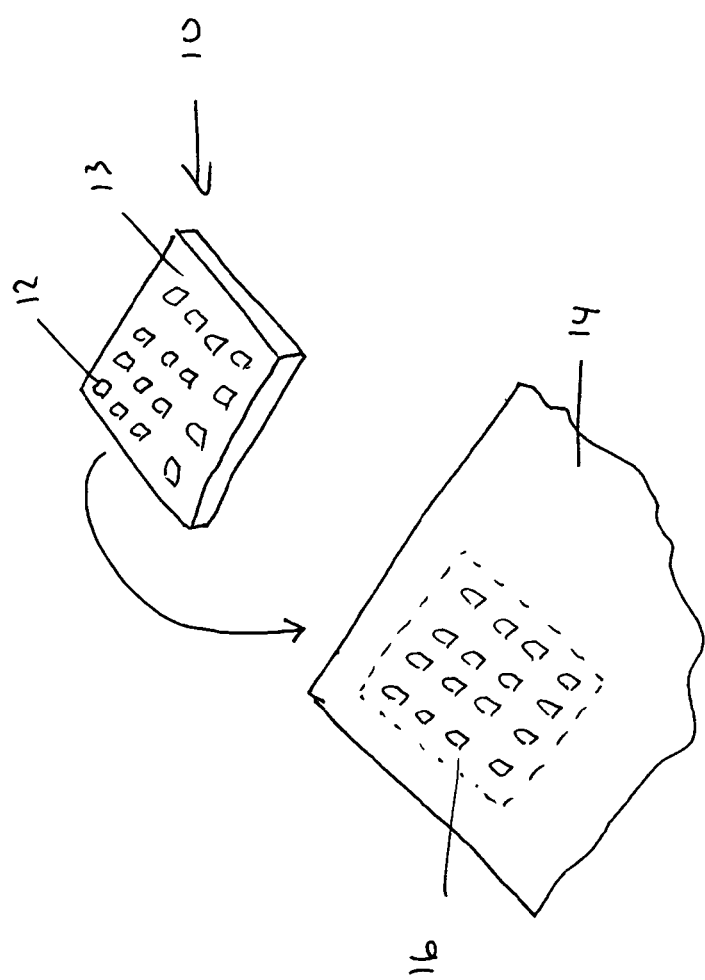
FIG. 1 generally illustrates a known flip chip with a bump array that is applied to bonding pads of a substrate.
Figure 2:
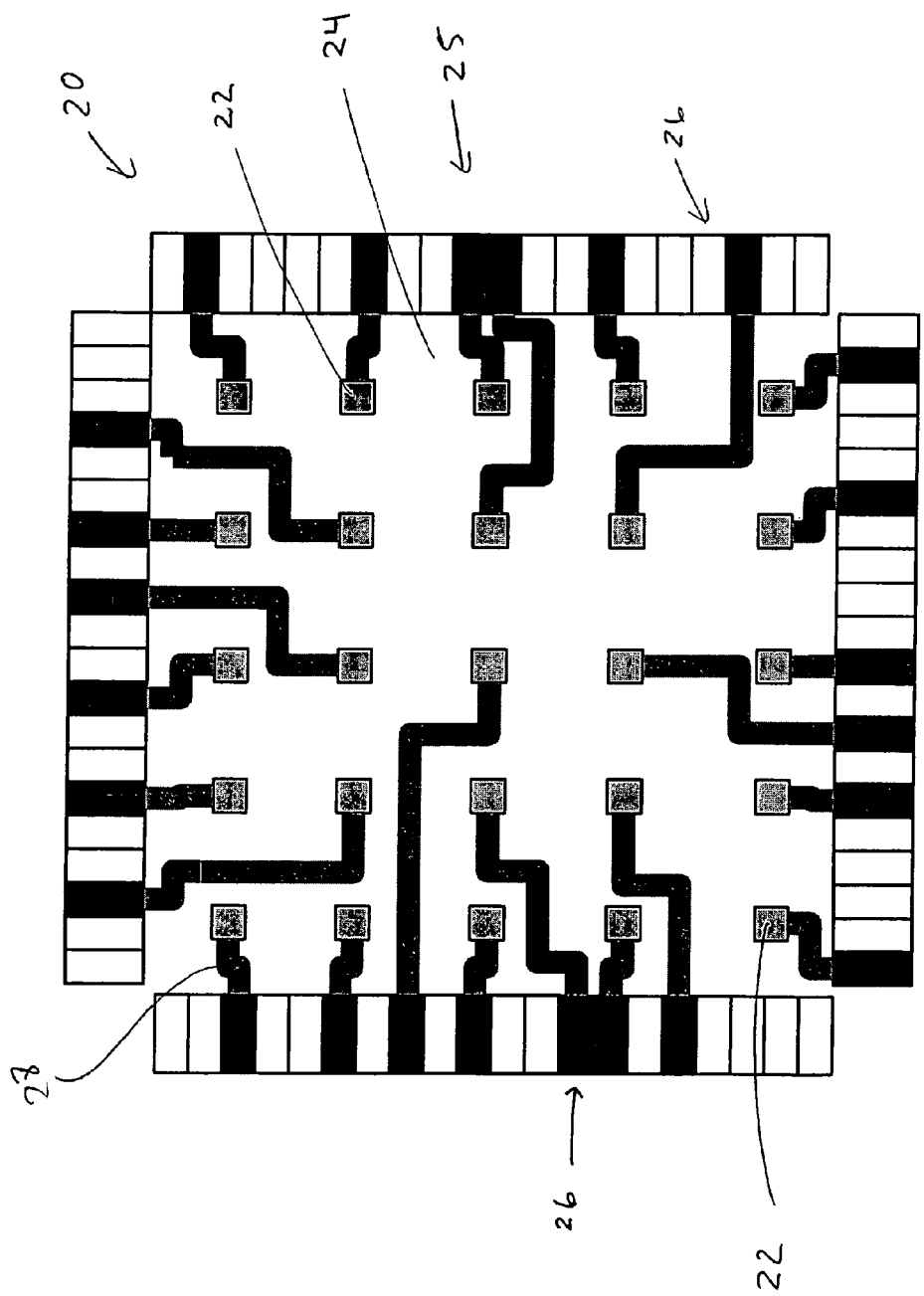
FIG. 2 generally illustrates a known peripheral I/O flip chip having bump array over a core of the chip and I/O pads arranged around the core.
Figure 3:
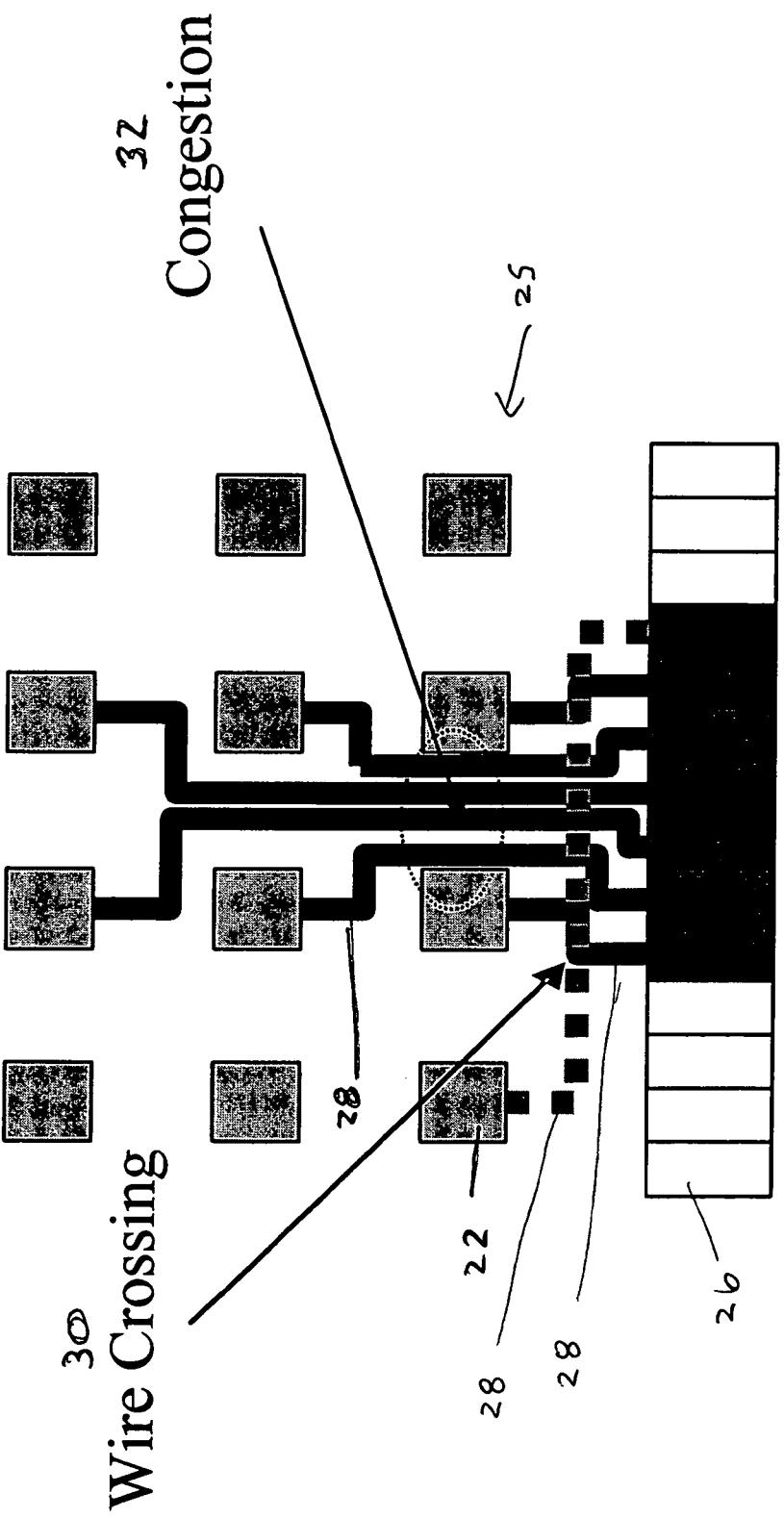
FIG. 3 generally illustrates bump—I/O pad connections and resulting congestion and wire crossings caused by known systems and methods.
Figure 4:
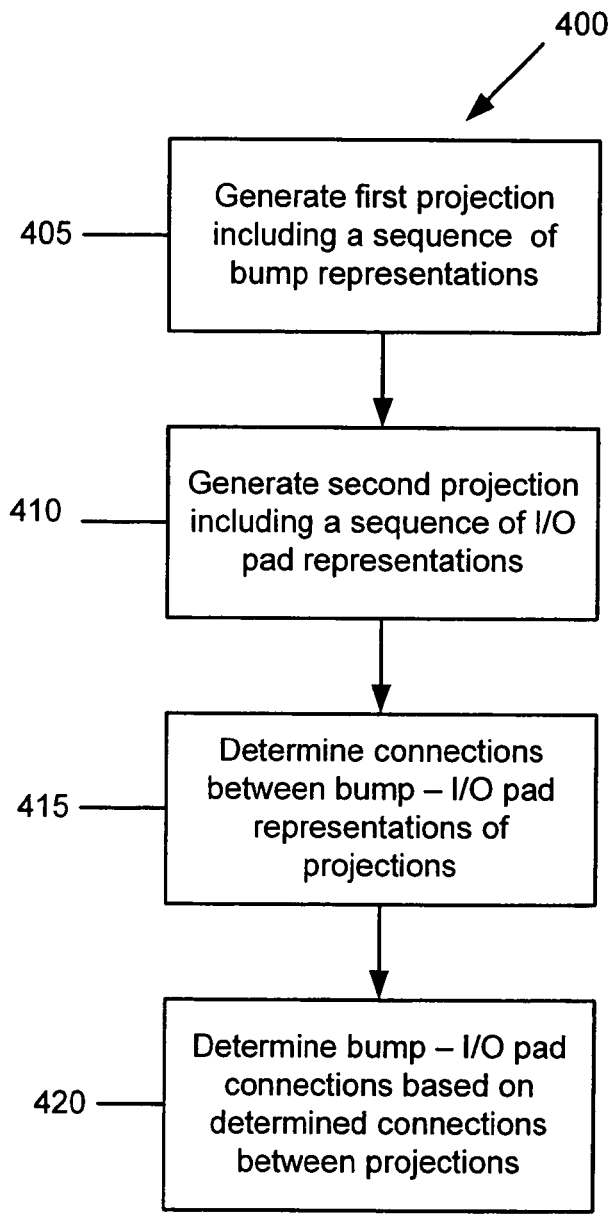
FIG. 4 is a flow diagram illustrating a method of implementing flip chip connections using bump and I/O pad projections according to one embodiment.

Referring to FIG. 4, one embodiment of the invention is directed to a method 400 for determining flip chip connections. In step 405, a first projection is generated and includes a sequence of representations or markers (generally "representations") of bumps of the flip chip. In step 410, a second projection is generated and includes representations or markers of I/O pads of the flip chip. The first and second representations can be, for example, numbers, letters, symbols and combinations thereof.

In step 415, connections between bump representations and I/O pad representations are determined using the projections. In one embodiment, only one bump representation is connected to only one I/O pad representation. Preferably, the bump representation—I/O pad representation connections are made so that no connection crosses another connection. In step 420, actual bump—I/O pad connections are determined using the connections of representations of the projections and can be implemented with an integrated or separate router. Tools that are used to carry out placement, assignment and routing functions can be separate tools or integrated into a single system. According to one embodiment, the placement, assignment and routing tools are part of an integrated system in which each tool is in communication with at least one or each of the other tools so that optimum flip chip connections can be implemented.

Embodiments can be used to assign I/O pads to fixed bump net assignments (package driven design) and to assign bumps to fixed I/O pad net assignments (chip driven design). Further, persons skilled in the art will appreciate that embodiments can be applied to other designs, such as irregular designs, e.g., irregular bump arrays, and designs having multiple I/O rows. Accordingly, the embodiments described in the specification and illustrates in the figures are not intended to be limited to a particular flip chip configuration, as persons skilled in the art will appreciate that embodiments can be applied to a variety of chip configurations and design styles.

I/O Pads Assigned to Fixed Bumps (Package Driven Design)

Figure 5:
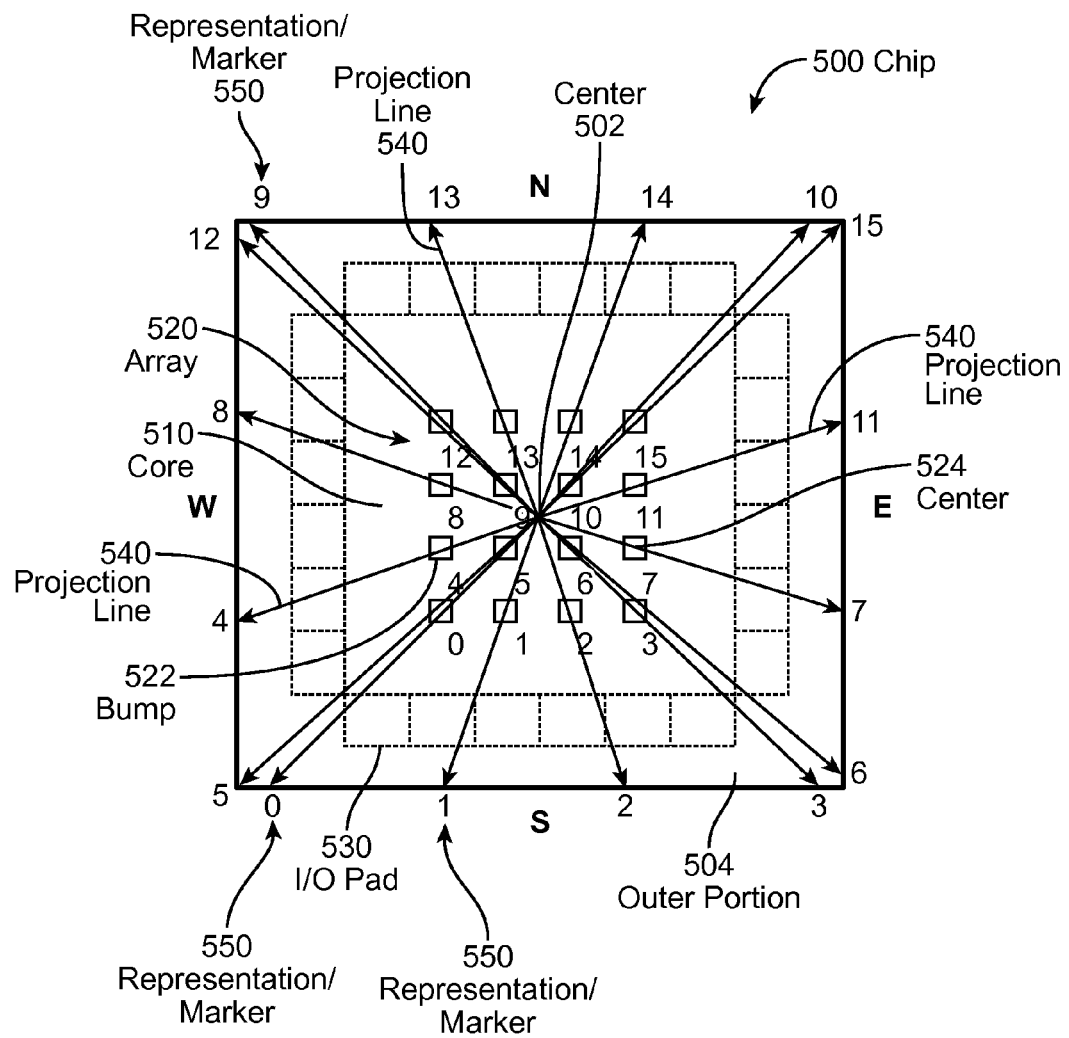
FIG. 5 illustrates projection lines that are drawn through bumps to generate a projection of bump representations according to one embodiment.

Referring to FIG. 5, a suitable flip chip 500 is typed a peripheral I/O flip chip having a core area 510 with an array 520 of bumps 522, each of which is assigned a net. The bumps 522 are surrounded by I/O pads 530. The illustrated flip chip 500 has a 4×4 array 525 of 16 bumps 522 and 24 I/O pads 530. Sixteen corresponding I/O pads can be placed in the 24 available I/O pad sites 530. The illustrated bumps are numbered 0 to 15, and the 24 I/O pads 530 are numbered 0 to 23. Thus, in this example, certain I/O pads 530 are occupied, whereas other I/O pads 530 are vacant. The chip 500 is shown as having North (N), East (E), South (S) and West (W) directions for reference. The illustrated flip chip is provided for purposes of illustration since persons skilled in the art will appreciate that various flip chip configurations with different numbers of bumps and I/O pads can be utilized.

Figure 6:
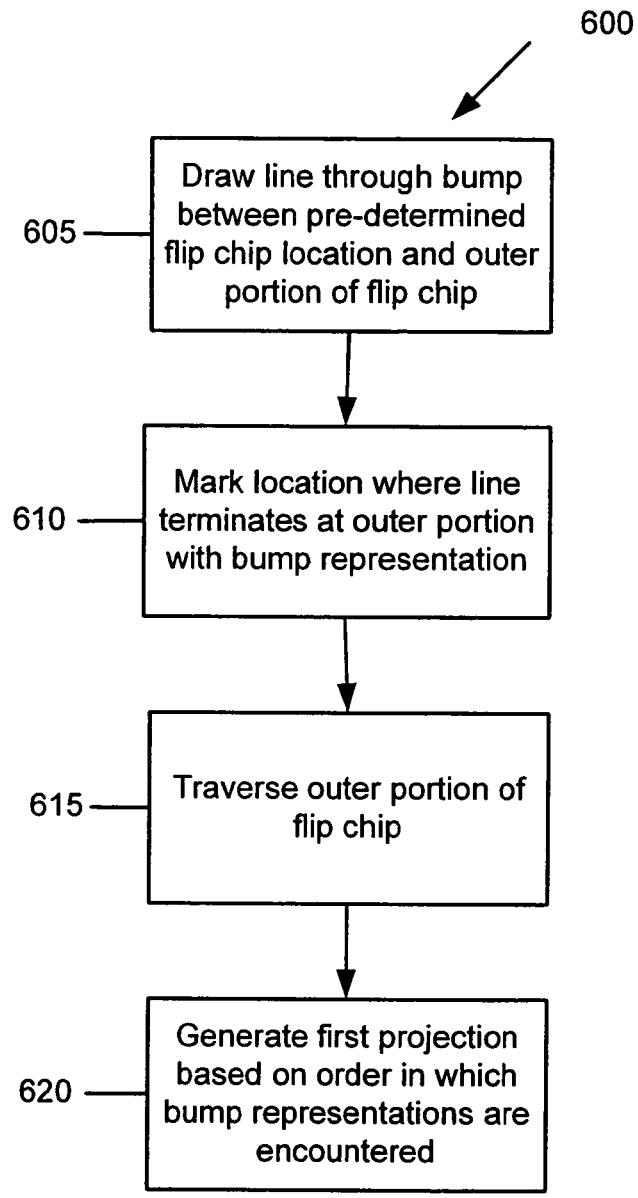
FIG. 6 is a flow diagram illustrating how a first projection having a sequence of bump representations is generated according to one embodiment.

Referring to FIG. 6, a method 600 of generating a projection a sequence of bump representations or markers includes drawing a line through a bump between a pre-determined location of the flip chip and an outer portion of the flip chip in step 605. In step 610, the location where the line terminates at the outer portion is marked with a bump marker or representation, thereby generating a sequence of markers or representations. This is repeated for each bump so that at least one line passes through each bump. In step 615, the outer portion (e.g., boundary) of the flip chip with the bump markers or representations is traversed, and in step 620, the first projection is generated based on the sequence of bump representations that is encountered during the traversing step 615. Implementation of these steps relative to an exemplary peripheral I/O flip chip are further illustrated in FIG. 5.

Referring again to FIG. 5, in the illustrated example, projection lines 540 are drawn through a center or midpoint 524 of a bump 522, and between a midpoint or center 502 of the flip chip 500 and an outer portion or boundary 504 of the flip chip 500. Projection lines can be drawn between other locations on the chip and other locations of a bump. Thus, midpoints are shown for purposes of illustration not limitation. A bump marker or representation 550 is assigned to the point at which a projection line 540 terminates at the flip chip boundary 504. The representation 550 can be a number (as shown), a letter a symbol or a combination thereof. In the illustrated embodiment, the representation or marker 550 is the number of the bump 522 through which the corresponding projection line 540 passes. These steps are performed for each of the 16 bumps 522 to generate a numbered sequence of 16 bump markers or representations 550 around the boundary 504 of the flip chip 500. Different numbers and configurations of bumps 522 can result in different projection line 540 patterns and sequences of representations 550. As shown in FIG. 5, the order of numbers of bump representations 550 is non-sequential.

In the illustrated embodiment, certain projection lines 540 are drawn from the center of the chip and through a single bump 522, and other projection lines 540 are drawn through two or more bumps 522 depending the bump and chip configuration (e.g., dimensions of bumps and chip, number of bumps, spacing of bumps, etc.). Bumps 522 having two projection lines 540 passing through them have one line that passes through the center 524 of the bump 522, and this line is the line that is used to generate the projection. For example, bump number 2 has one projection line that passes through the center of this bump, and this line terminates at the boundary as identified by representation "2." Two projection lines pass through bump number 3. One line is for bump number 3, and the other line is for bump number 6.

Figure 7:
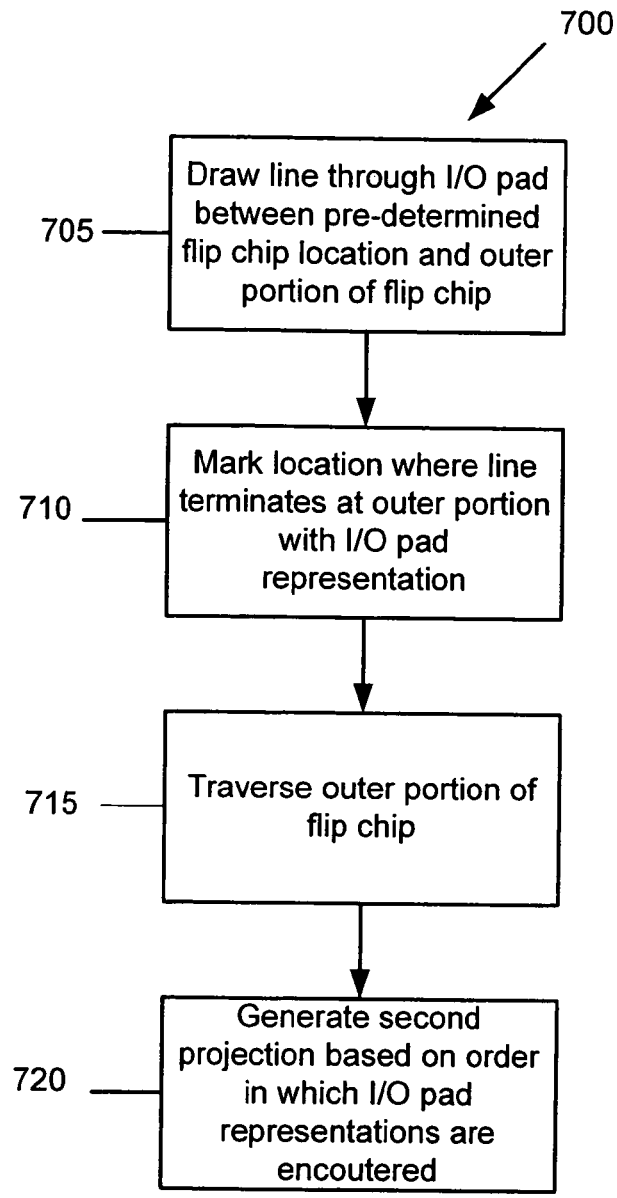
FIG. 7 is a flow diagram illustrating how a second projection having a sequence of I/O pad representations is generated according to one embodiment.

Referring to FIG. 7, a similar projection method is performed with regard to the I/O pads of the flip chip. FIG. 7 illustrates a method 700 of generating a projection of I/O pad representations or markers and includes the step of drawing a line through an I/O pad between a pre-determined location of the flip chip and an outer portion of the flip chip in step 705. In step 710, the location where the projection line terminates at the outer portion is marked with an I/O pad marker or representation. This is repeated for each I/O pad, thereby generating a sequence of markers or representations around the outer portion of the chip. In step 715, the outer portion of the flip chip with the I/O pad markers or representations is traversed, and in step 720, the second projection is generated based on the sequence of I/O pad representations that is encountered during the traversing step 715. Implementation of these steps relative to the exemplary peripheral I/O flip chip and illustrated in FIG. 8.

Figure 8:
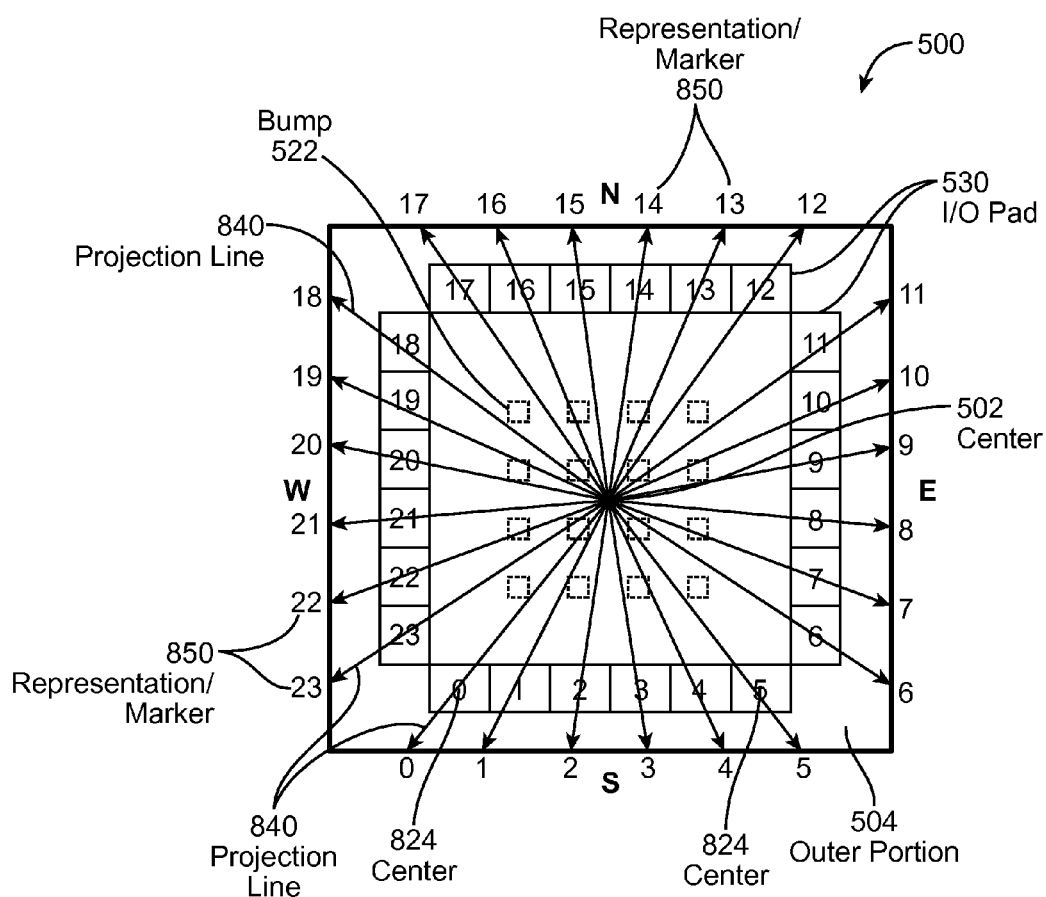
FIG. 8 illustrates lines drawn through I/O pads to generate a projection of I/O pad representations according to one embodiment.

Referring to FIG. 8, a projection line technique that is similar to that shown in FIG. 5 is used but with respect to I/O pads. In the illustrated example, projection lines 840 are drawn through a center or midpoint 824 of an I/O pad 530, and between a midpoint or center 502 of the flip chip 500 and an outer portion or boundary 504 of the flip chip 500. Projection lines 840 can be drawn between other locations of the chip and other locations of an I/O pad. An I/O pad marker or representation 850 is assigned to the point at which the projection line 840 terminates at the flip chip boundary 504. The representation 850 can be a number (as illustrated), a letter a symbol, or a combination thereof. In the illustrated embodiment, the I/O pad marker 850 is the number of the I/O pad 530 through which the corresponding line 840 passes. These steps are performed for each of the 24 I/O pads 530 to generate a numbered sequence of 24 I/O pad markers or representations 850 around the boundary 504 of the flip chip 500. Different arrangements and numbers of I/O pads can result in different projection line patterns. In the illustrated embodiment, the order of numbers of I/O pad representations 850 is sequential, whereas the order of numbers of bump representations 550 is non-sequential. Further, each projection line 840 passes through only one I/O pad 530, whereas projection lines 540 may pass through one or multiple bumps 522.

Figure 9:
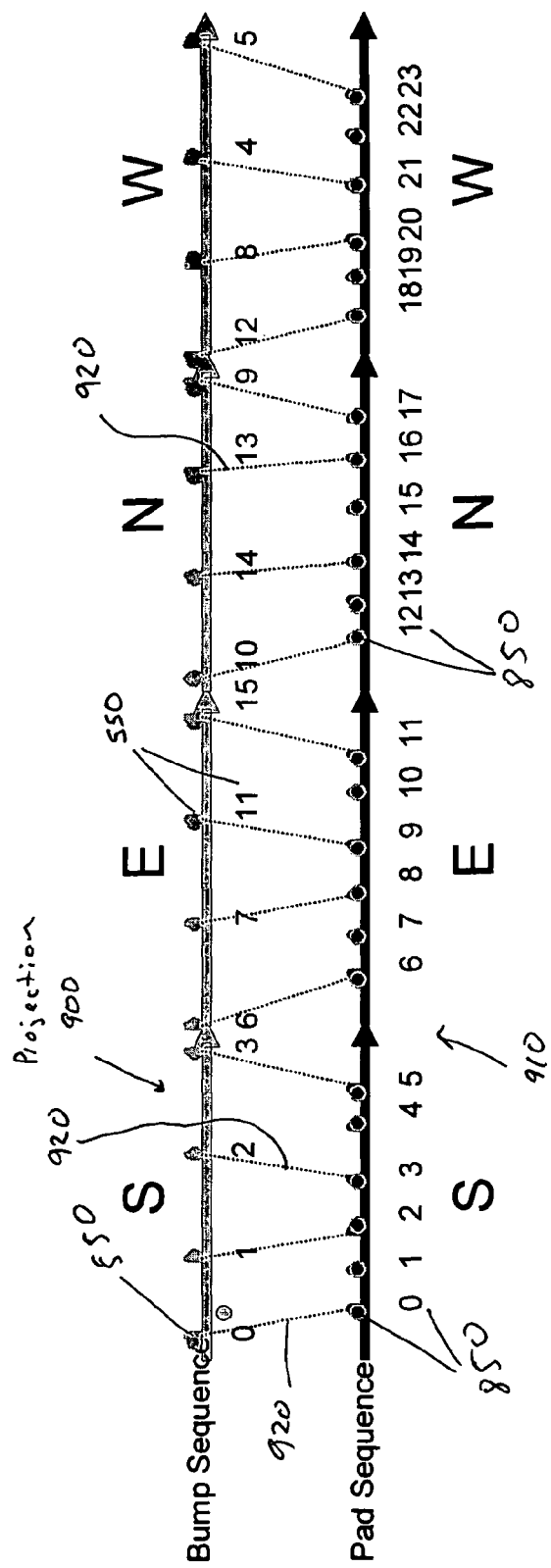
FIG. 9 illustrates a projection including bump representations, a projection including I/O pad projections and connections between I/O pad and bump representations.

Referring to FIG. 9, the outer boundaries 504 shown in FIGS. 5 and 8 are unfolded, converted or straightened into projections. The outer boundary of the chip shown in FIG. 5 is traversed and straightened into a projection 900 of a sequence bump representations, and the outer boundary 504 of the chip shown in FIG. 8 is straightened into a projection 910 of I/O pad representation 850. In the illustrated embodiment, each projection includes four segments, according to the four "S," "E," " " "N," and "W" sides of the flip chip 500, and the arrows between projection segments represent the corners of the flip chip 500.

In the illustrated embodiment, the projections 900 and 910 are linear and the same shape and aligned with each other, according to the N, E, S, W reference points. The top or bump representation 900 projection includes a sequence of 16 bumps: 0, 1, 2, 3, 6, 7, 11, 15, 10, 14, 13, 9, 12, 8, 4 and 5, and the bottom or I/O pad representation projection 910 includes a sequence of 24 I/O pads: 0, 1, 2, 3, 4, 5, 6, 7, 8, 9, 10, 11, 12, 13, 14, 15, 16, 17, 18, 19, 20, 21, 22 and 23.

After the projections 900 and 910 are formed, connections 920 between bump and I/O pad representations are completed. In the illustrated example, the 16 bump representations 550 are connected to the I/O pad representations 850 as set forth below:

| Bump Representation 550 | I/O Pad Representation 850 |
|---|---|
| 0 | 0 |
| 1 | 2 |
| 2 | 3 |
| 3 | 5 |
| 4 | 6 |
| 5 | 8 |
| 6 | 9 |
| 7 | 11 |
| 8 | 12 |
| 9 | 14 |
| 10 | 16 |
| 11 | 17 |
| 12 | 18 |
| 13 | 20 |
| 14 | 21 |
| 15 | 23 |

I/O pad representations 1, 4, 7, 10, 13, 15, 19 and 22 are not utilized in this example given the number of bump representations and I/O pad representations. These unused I/O pad representations 850, however, could be utilized with alternative connections 920. Further, other flip chips will likely involve different numbers of bumps 522 and I/O pads 530 and different connections between bump representations 550 and pad representations 850.

As shown in FIG. 9, there may be instances when a bump representation 550 can be assigned to different I/O pad representations 850. For example, bump representation 11 can be connected to either I/O pad representation 9 or I/O pad representation 10. The I/O pad representation assignment can be determined based on, for example, minimizing connection lengths or preventing one connection from crossing another connection. In the illustrated example, no bump representation—I/O pad representation connection crosses 920 another bump representation—I/O pad representation connection 920.

Figure 10:
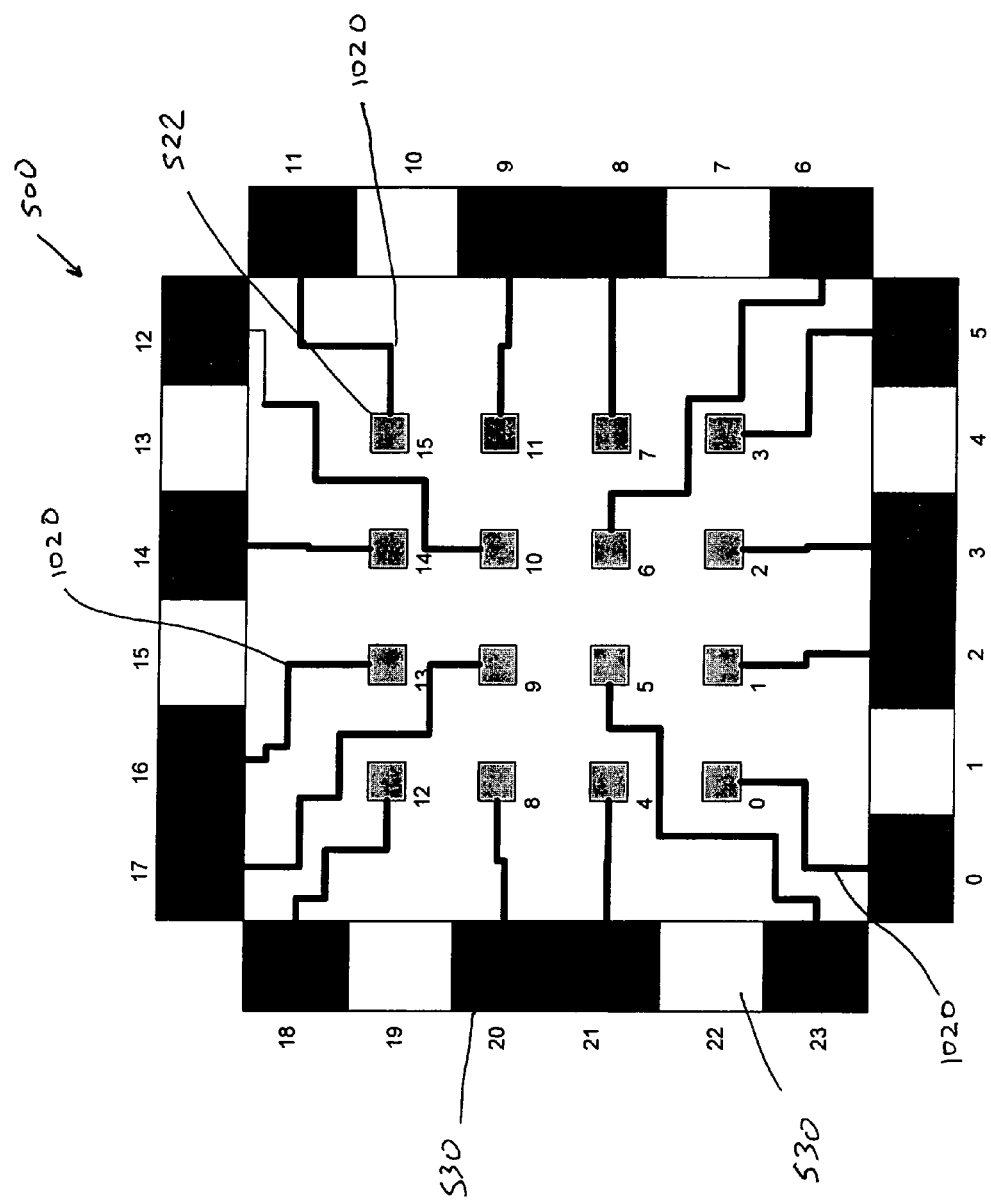
FIG. 10 illustrates I/O pads being connected to fixed bumps of a flip chip according to connections between bump and I/O pad representations shown in FIG. 9.

Referring to FIG. 10, the connections 920 determined as shown in FIG. 9 are implemented as connecting 1020 between actual bumps 522 and I/O pads 530 of the flip chip 500, e.g., with an integrated or separate router. As shown in FIG. 10, connections 1020 are advantageously completed without crossing. Instead, each bump—I/O pad connection 1020 is a direct connection and does not overlap any other connection 1020. According to one embodiment, the connections 1020 are implemented within a single redistribution layer without having to use additional layers to complete the connection 1020. As shown in FIG. 10, embodiments provide flip chip connections 1020 without crossing connections and without congestion, and provide significant improvements over known techniques, particularly when connections must be made within a single redistribution layer and for larger numbers of two-pin nets. The steps described above are related to each other and can advantageously be implemented using integrated placer, router and net assignment tools, rather than separate tools that are not aware of the needs of other tools and process steps.

There may be some instances in which crossing free pad placement as shown in FIG. 10 does not result in a routable design. For example, a design may not be routable due to a number of nets passing through two bumps 522 being larger than the number of nets that can be accommodated within that space. There may also be redistribution layer blockage between bumps 522 causing reduced routing resources. To address these problems, alternative embodiments advantageously adjust the sequence of representations and/or remove or delete representations of a projection according to available routing resources.

Figure 11:
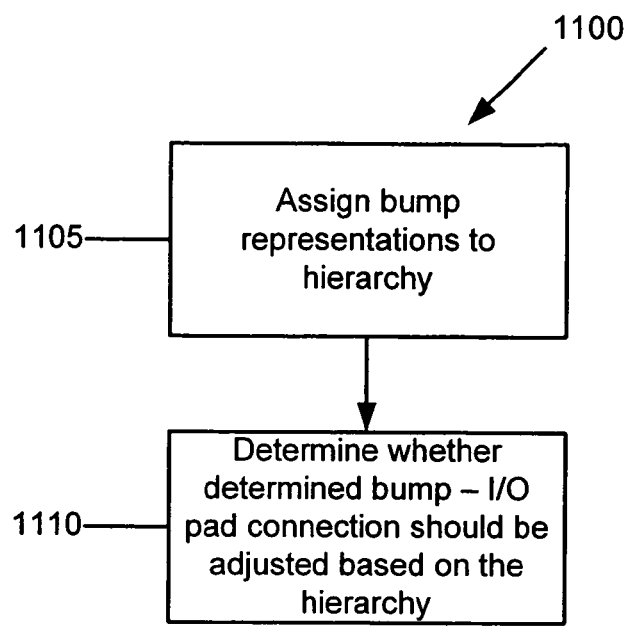
FIG. 11 is a flow diagram illustrating a method of adjusting a sequence of bump representations of a projection using a hierarchy analysis according to one embodiment.

Referring to FIG. 11, alternative embodiments provide further enhancements by a method of 1100 of adjusting a projection in the event that there are too many connections within a particular area. According to one embodiment, these benefits are achieved by assigning bumps 522 to a hierarchy having a plurality of levels in step 1105. Thus, each resulting bump representation 550 is assigned to a hierarchical level. In step 1110, a determination is made concerning whether an order of bump representations 550 in a projection 900 should be adjusted in order to reduce congestion based on an analysis of the hierarchical arrangement of bump representations 550.

Figure 12:
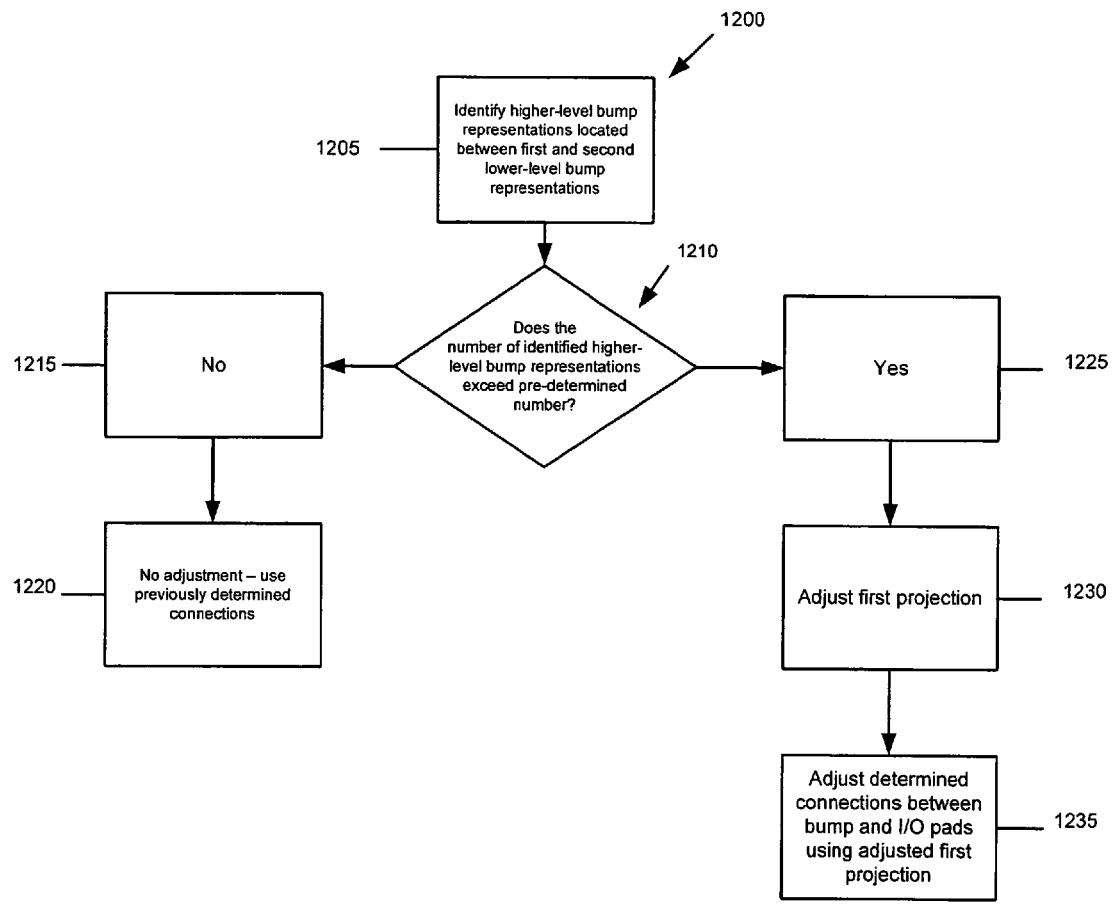
FIG. 12 is a flow diagram further illustrating a hierarchy analysis for adjusting a projection according to one embodiment.

FIG. 12 further illustrates one embodiment of a method 1200 of determining whether a projection 900 should be adjusted based on a hierarchical analysis. In step 1205, higher level bump representations in the projection 900 that are located between first and second lower-level bump representations are identified. According to one embodiment, the first and second lower level bump representations are assigned to the same lower hierarchical level. In step 1210, a determination is made whether the number of identified higher-level bump representations exceeds a pre-determined number, which can be 2 or another pre-determined number corresponding to an acceptable number of nets that pass through two bumps.

If the answer is No 1215, then the number of identified higher level bump representations does not exceed the pre-determined number, and in step 1220, no adjustment of the projection 900 is necessary. Thus, in step 1225, the original bump projection 900 can be used to implement bump—I/O pad connections 920 as shown in FIG. 10.

If the answer is Yes 1225, then the number of identified higher level bump representations exceeds the pre-determined number, indicating congestion caused by too many nets between two bumps. In order to relieve this congestion, in step 1230, the projection 900 is adjusted by, for example, changing a sequence of and/or removing or deleting one or more bump representations 550 so that the number of higher-level bump representations between the two lower level representations is less than or equal to the pre-determined number. According to one embodiment, if the congestion is not solved by changing the sequence of bump representation, then a higher tier bump representation can be removed from the sequence. In step 1235, the adjusted projection is then used to implement bump—I/O pad connections. FIGS. 13-18 illustrate examples of hierarchical models, and how a hierarchical model can be used to analyze congestion and adjust a projection and resulting bump—I/O pad connections 1020 as necessary.

Figure 13:
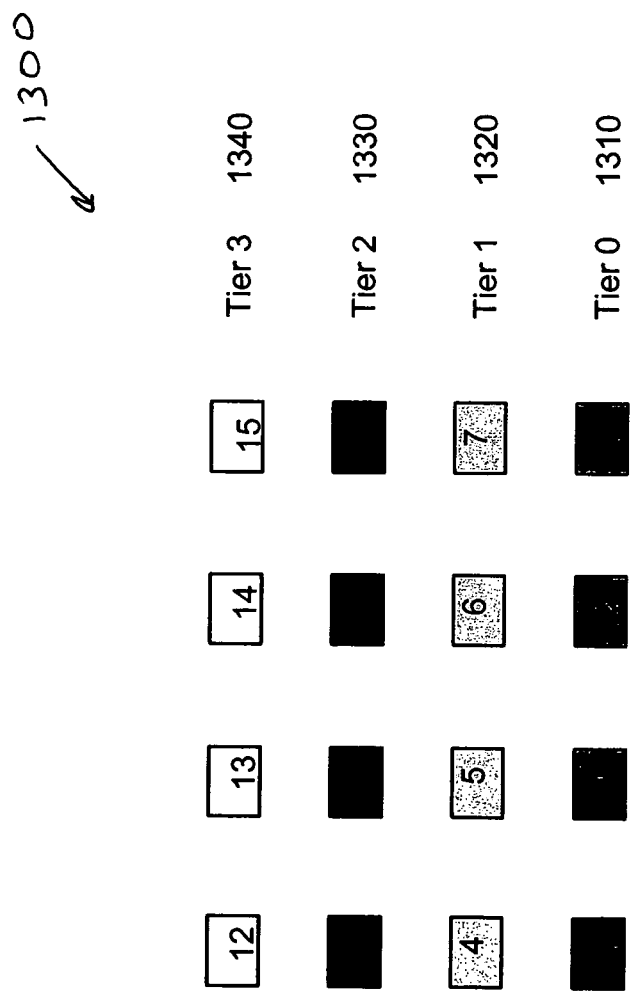
FIG. 13 illustrates a bottom-up hierarchy of bumps in which the bottom row is the lowest hierarchical level and the top row is the highest hierarchical level.

FIG. 13 illustrates 16 bumps 522 of a flip chip 500. According to one embodiment, bumps 522 are assigned to a bottom-up hierarchy 1300 in which different rows represent different hierarchical levels. For example, the bottom row 1310 represents the bottom hierarchical level or "tier 0," the next 13320 row up represents "tier 1," the next row 1320 up represents "tier 2," and the top row 1330 represents the highest hierarchical level or "tier 3."

Figure 14:
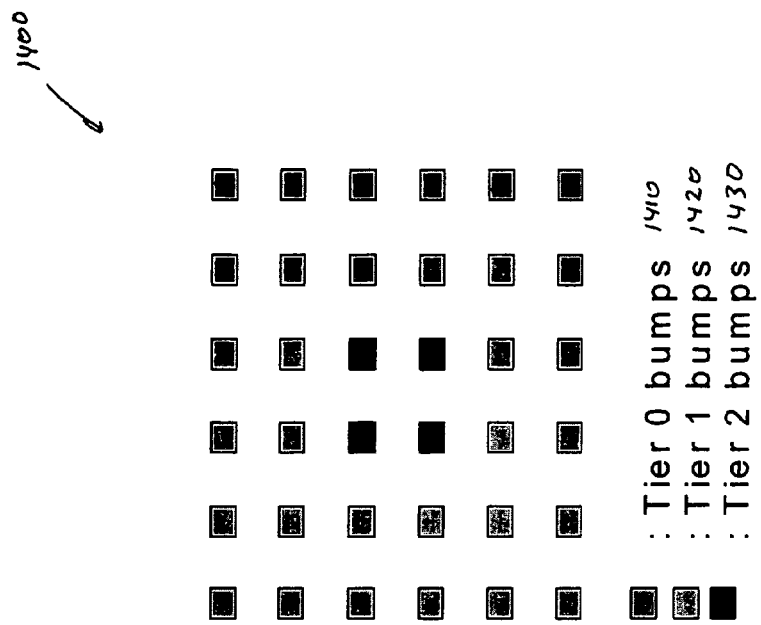
FIG. 14 illustrates an outside-in hierarchy of bumps in which an outer ring of bumps is the lowest hierarchical level and the innermost ring is the highest hierarchical level.

FIG. 14 illustrates another exemplary hierarchical model 1400 which is an inside-out model in which different rings of bumps are assigned to different hierarchical levels. For example, the an outer ring 1400 (shown as including 20 bumps represents the bottom hierarchical level or "tier 0," the next inner ring 1420 (shown as including 12 bumps) represents "tier 1," and the inner most ring 1430 (shown as including 4 bumps) represents "tier 2." Indeed, persons skilled in the art will appreciate that actual flip chips can have various numbers of bumps and various numbers of hierarchical rows and rings. Thus, the examples of hierarchical models 1300 and 1400 shown in FIGS. 13 and 14 are provided for purposes of illustration, not limitation. The hierarchical model shown in FIG. 13 is discussed in further detail with reference to FIGS. 15-18.

Figure 15:
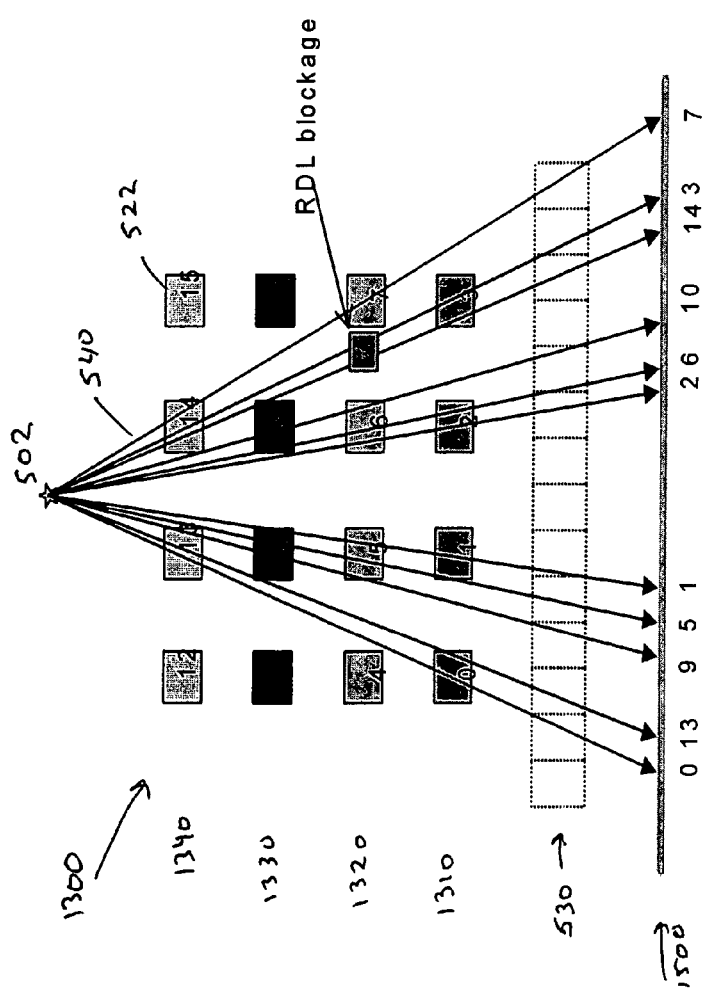
FIG. 15 illustrates projection lines drawn through bumps and that are assigned to a bottom-up hierarchy to generate a bump projection according to one embodiment.

FIG. 15 illustrates a portion of a flip chip 500 and projection lines drawn from a center 502 of the chip and through an array of bumps 522 that are assigned to hierarchical levels 1300, 13020, 1330, 1340 based on the row of the bumps. Thus, bumps 0-3 are assigned to the lowest level tier 0, bumps 4-7 are assigned to tier 1, bumps 8-11 are assigned to tier 2 and bumps 12-15 are assigned to the highest level tier 3. Projection lines 540 extend between the center 502 of the chip to an outer portion 504 of the chip. The resulting projection 1500 has the following sequence of bump representations 550 and associated (tier) hierarchical levels: 0 (tier 0), 13 (tier 3), 9 (tier 2), 5 (tier 1), 1 (tier 0), 2 (tier 0), 6 (tier 1), 10 (tier 2), 14 (tier 3), 3 (tier 0) and 7 (tier 1). This projection 1500 and hierarchical sequence is shown in FIG. 16.

Figure 16:
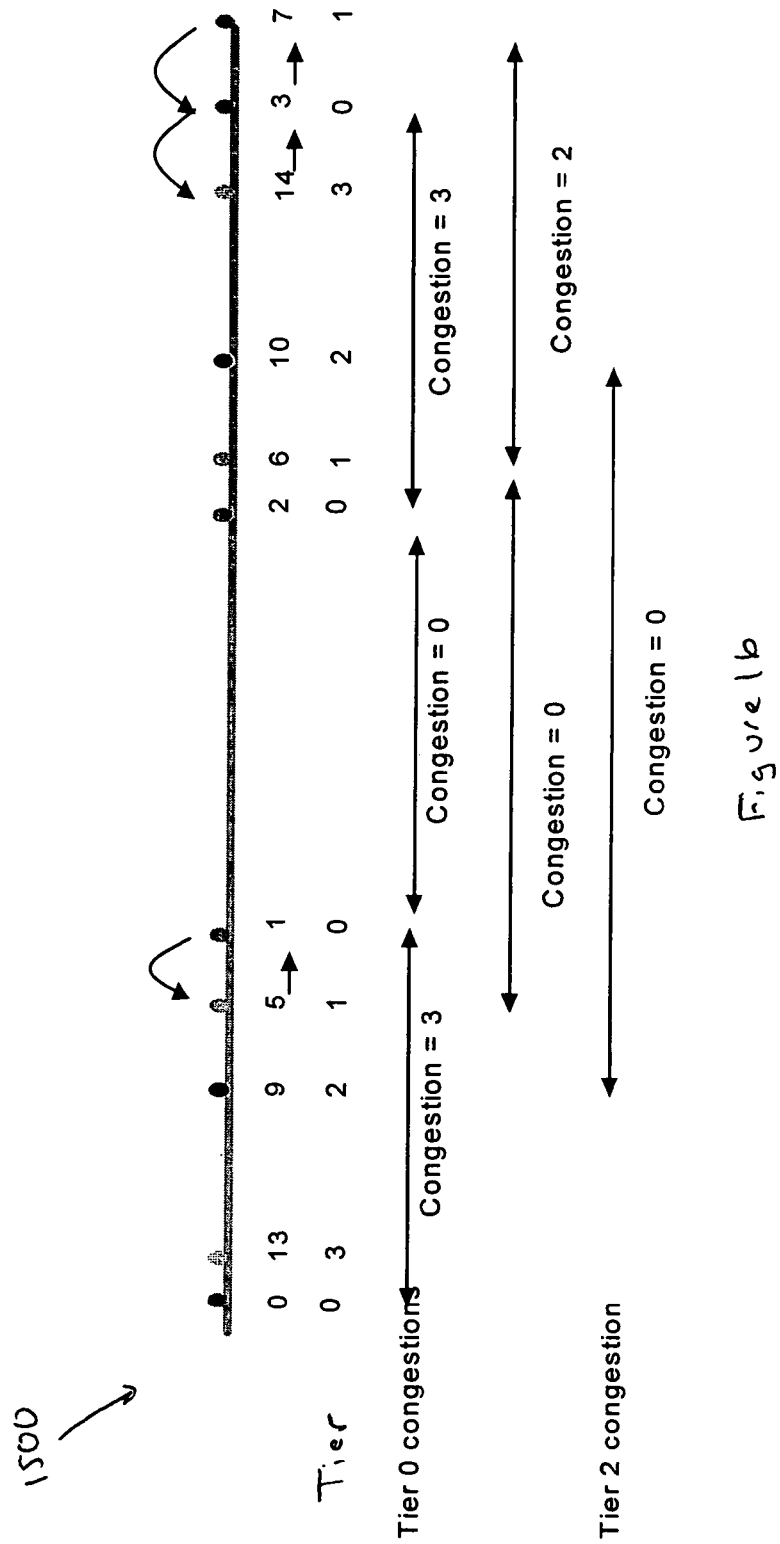
FIG. 16 illustrates adjusting a projection based on a hierarchy analysis according to one embodiment.

Referring to FIG. 16, after obtaining the bump projection sequence, the sequence is scanned to determine the number of higher-level bump representations between pairs of lower-tier bump representations (e.g., representations at the same hierarchical level). For example, between two "tier 0" bump representations (representation 0 and representation 1), there are three higher tier bump representations: 13 (tier 3), 9 (tier 2) and 5 (tier 1). Thus, the number of higher-level representations (3) exceeds the pre-determined number (2 in this example). This indicates congestion between bumps 0 and 1.

This congestion can be reduced by moving a bump representation to change the order and hierarchical structure of the projection. As shown in FIG. 16, the bump representations number 1 and 5 are switched. For example, the lower level bump representation 1 can be moved ahead of the higher level representation 5. As a result, the number of higher-level bump representations between lower level representations 0 and 1 is reduced from three to two and removes a net from a congested area.

A similar analysis can be performed with respect to other sections of the projection 1500. For example, when the scan of bump representations reaches bump representation number 14, the congestion since the last tier 0 bump representation 2 exceeds the limit of two higher level bump representations. In order to reduce the resulting congestion, bump representation number 3 can be moved ahead of bump 14. The next bump representation encountered is number 7. There are two higher tier bump representations (10 and 14) between lower level bump representations 6 and 7. In order to reduce congestion, bump representation number 7 can be shifted ahead of bump representation 14. The final bump sequence after adjustments is shown in FIG. 16.

Figure 17:
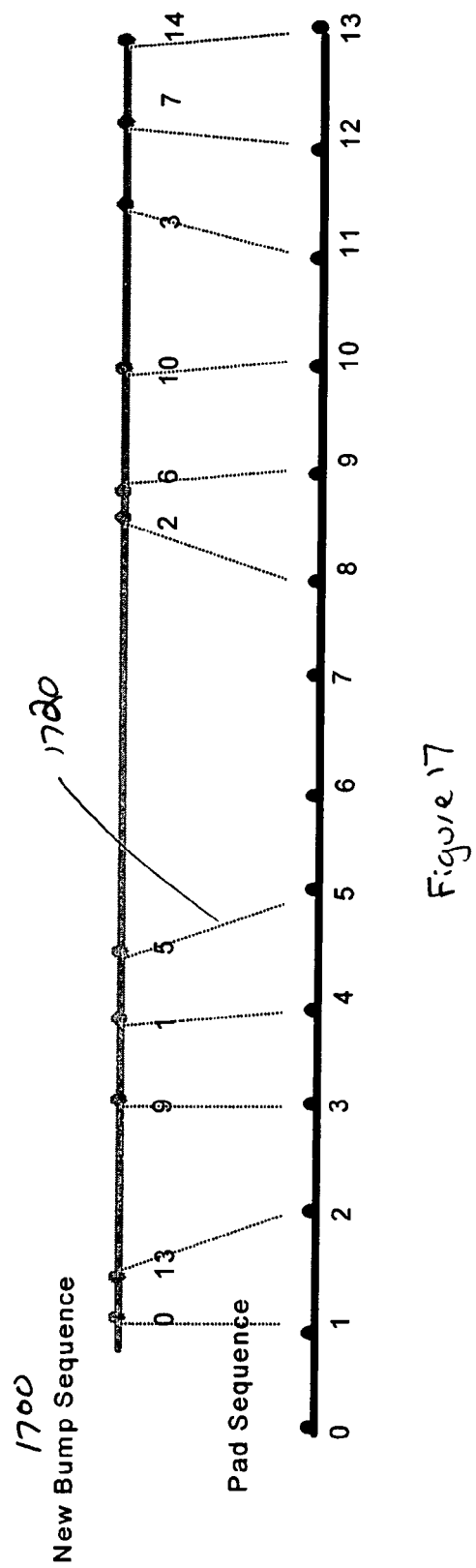
FIG. 17 illustrates an adjusted projection resulting from a hierarchical analysis and connections between bump and I/O pad representations based on the adjusted projection.

Referring to FIG. 17, after the bump representations of the projection 1500 are adjusted to generate an adjusted projection 1700, the connections 1720 between bump and I/O pad representations can be implemented. Each bump representation is connected to an I/O pad representation. In this example, there are more I/O pad representations than bump representations and, therefore, some of the I/O pad representations are not utilized.

Figure 18:
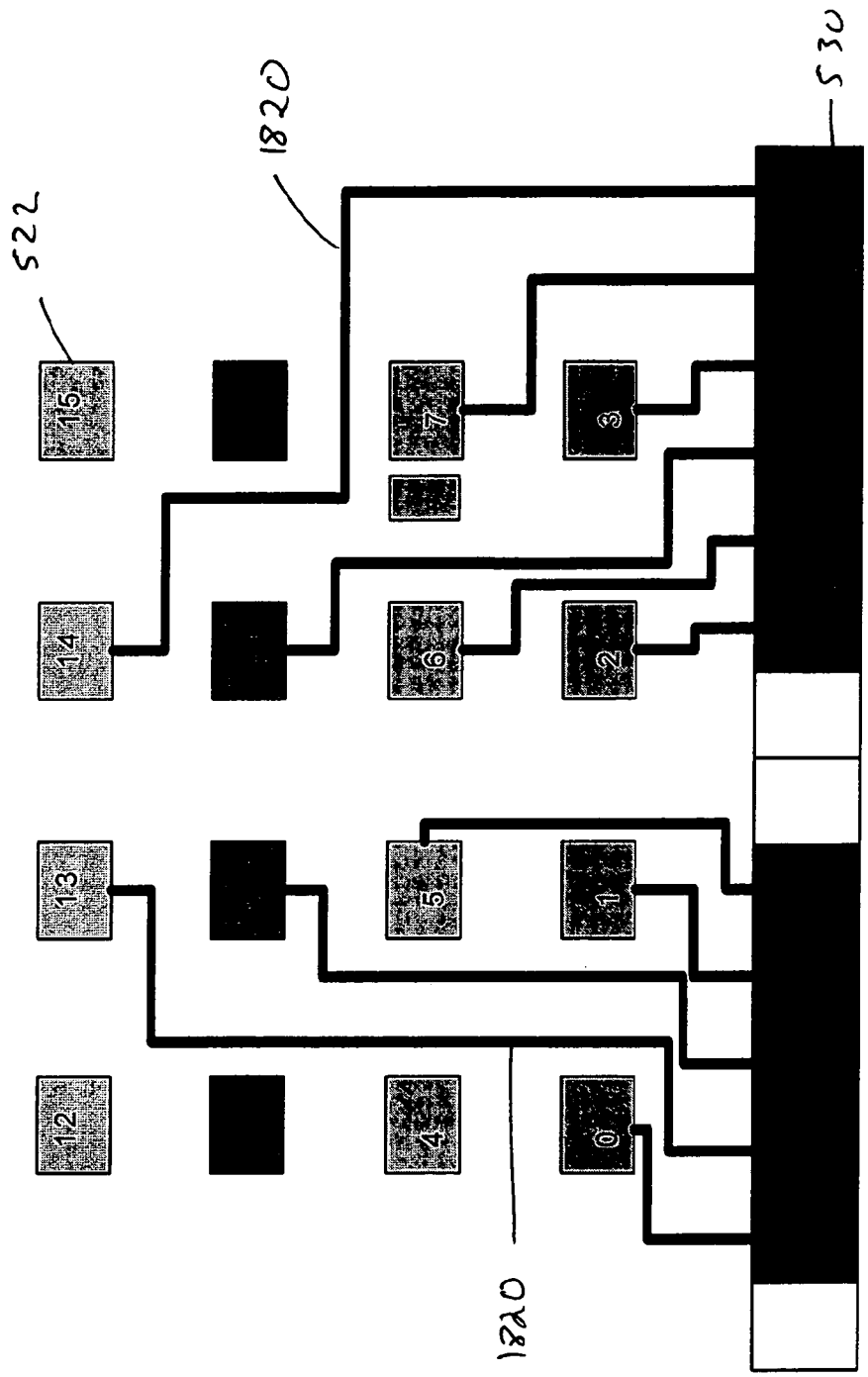
FIG. 18 illustrates I/O pads being assigned to fixed bumps of a flip chip according to connections between bump and I/O pad representations shown in FIG. 17.

Referring to FIG. 18, the adjusted determined connections 1720 shown in FIG. 17 are implemented as connections between actual bumps 522 and I/O pads 530 of the flip chip 500, e.g., with an integrated or separate router. Some of the connections 1820 may be the same as connections 1720 since they may not have been adjusted. As shown in FIG. 18, the advantageously completed without crossing connections 1820 and, in addition, with reduced or not congestion. The connections can advantageously be implemented within a single redistribution 1820 layer without having to use additional layers to complete the connection 1820.

Bumps Assigned to Fixed I/O Pads

The embodiments described above involve I/O pads being assigned to fixed bumps for package driven designs. The same principles and techniques, including hierarchical adjustments, can be applied to assigning bumps to fixed I/O pads in chip driven designs. Following is a summary of how embodiments can be applied to fixed 210 pads but certain details are omitted to avoid repetition.

Referring to FIG. 19, projection lines 540 are drawn through, for example, a center or midpoint 524 of each bump 522, and between a midpoint or center 502 of the flip chip 500 and an outer portion or boundary 504 of the flip chip 500 also shown in FIG. 5. A bump marker or representation 550 is assigned to the point at which the line terminates at the flip chip boundary resulting in a projection. The representation 550 can be a number (as illustrated), a letter a symbol or a combination thereof. In the illustrated embodiment, the representation 550 is the number of the bump 522 through which the corresponding projection line 540 passes. These steps are performed for each bump to generate a projection 900 of numbered sequence of 16 bump markers or representations around the boundary of the flip chip. As shown in FIG. 19, the order of numbers of bump representations is non-sequential. Referring to FIG. 20, projection lines can be generated in manner that is similar to that shown in FIG. 8 to generate a projection 910 with an ordered sequence of I/O pad representations 850.

Figure 23:
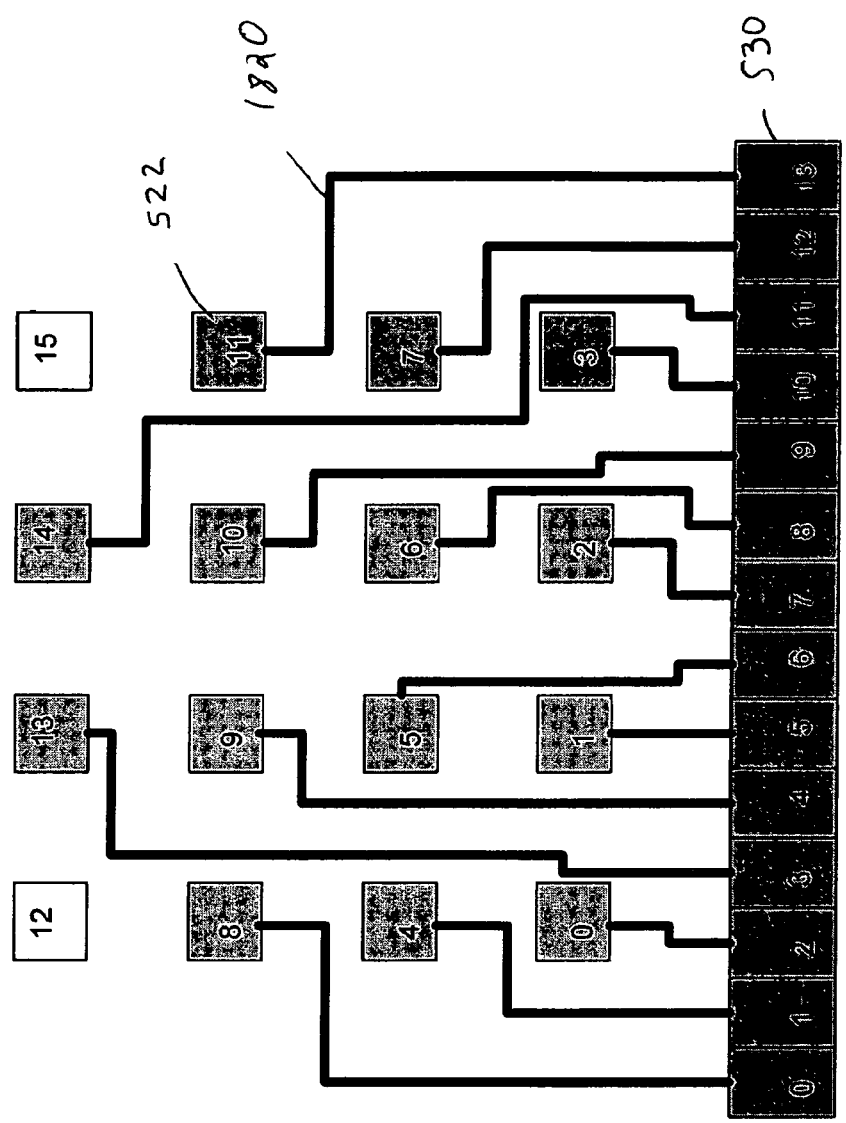
FIG. 23 illustrates bumps being assigned to fixed I/O pads of a flip chip according to connections between bump and I/O pad representations shown in FIG. 22.

Referring to FIG. 21, if necessary, the projection 900 can be adjusted as in order to correct congestion based on a hierarchical analysis, as described above with reference to FIGS. 11-18. The adjusted determined connections 720 between bump and I/O pad representations (or the initially determined connections) are then completed as shown in FIG. 22. Referring to FIG. 23, the determined bump representation—I/O pad representation connections (or adjusted determined connections represented in FIG. 21) are implemented as connections 1820 between actual bumps 522 and fixed I/O pads 530 of the flip chip 500, e.g., with an integrated or separate router. As shown in FIG. 23, embodiments advantageously implement connections without crossing connections and, in addition, with reduced or no congestion.

Persons skilled in the art will appreciate, embodiment of the invention provide a number of advantages over known tools and methods. Embodiments determine flip chip connections in an automated manner, rather than relying on manual editing by a user. Thus, embodiments take three separate but related components/processing steps and join them into an integrated solution. For example, with embodiments, bump assignment and pad placement for a typical 800+bump design can be implemented in about 20 seconds, whereas methods that rely on manual editing can require one week or more. Further, with embodiments, routing steps and components are aware of pad placement and bump assignment components.

Additionally, embodiments eliminate or reduce crossings and congestion, thereby reducing jogs and making length estimations more accurate. In contrast, known tools may minimize routing length, but may not reduce or eliminate crossing connections and congestion, and may nevertheless require manual editing to achieve these results.

Embodiments also make it easier to implement placement constraints, such as pad groups (certain pads must be placed together), balanced pair, length matching. All these arrangements can be accomplished by adjusting I/O and bump representation sequences in projections, thus improving connections between I/O and bump representations and connections between I/O pads and bumps of the flip chip. Embodiments are also more space efficient than known tools since they facilitate use of pads near the corners of the flip chip as a result of projection lines that are directed in multiple directions.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. Further, embodiments can be applied to different placement constraints, including side constraints, group constraints, order constraint, length matching constraints. Additionally, embodiments can be used for Printed Circuit Board (PCB) design involving a single routing layer and two pint nets. The specification and drawings are, accordingly, to be regarded in an illustrative rather than restrictive sense.

The invention claimed is:

1. A method for determining flip chip connections, comprising:
using at least one computing system having at least one processor to perform a process, the process comprising:
generating a first projection having representations of bumps arranged over a core of the flip chip by at least drawing a line or a line segment through a bump between a location within a first ring of a flip chip and an outer portion of the flip chip, wherein
the representations of the first projection comprise at least one representation of the first ring and at least one representation of a second ring, and
the first ring is an inner ring to and is different from the second ring;
generating a second projection having representations of fixed I/O pads arranged around the core; and
determining connections between bumps and fixed I/O pads based at least in part on representations of respective first and second projections so that no bump—fixed I/O pad connection crosses another bump—fixed I/O pad connection.

2. The method of claim 1, determining connections further comprising determining connections between bumps and fixed I/O pads based on representations of respective first and second projections so that only one bump is connected to only one fixed I/O pad.

3. The method of claim 1, further comprising implementing the determined connections with a router.

4. The method of claim 1, all of the determined connections being completed within a single redistribution layer.

5. The method of claim 1, further comprising:
assigning bump representations to a hierarchy that includes a plurality of levels, at least one bump representation being assigned to a level; and
determining whether any determined bump—fixed I/O pad connection should be adjusted based on the hierarchy.

6. The method of claim 5, determining whether any bump—fixed I/O pad connection should be adjusted comprising:
in the first projection, identifying higher-level bump representations that are located between first and second lower-level bump representations;
determining whether the number of identified higher-level bump representations exceeds a pre-determined number; and
if the number of identified higher-level bump representations exceeds the pre-determined number,
adjusting the first projection, and
adjusting the determined connections between bumps and fixed I/O pads using the adjusted first projection.

7. The method of claim 6, wherein the first and second lower-level bump representations are in the same hierarchical level.

8. The method of claim 6, adjusting the first projection comprising:
changing a sequence of bump representations in the first projection so that the number of higher level bump representations between the first and second lower level bump representations in the adjusted first projection is less than or equal to the pre-determined number.

9. The method of claim 6, adjusting the first projection comprising:
deleting one or more bump representations in the first projection so that the number of higher level bump representations between the first and second lower level bump representations in the adjusted first projection is less than or equal to the pre-determined number.

10. The method of claim 6, wherein the pre-determined number is two.

11. An integrated and automatic circuit design tool including a processor for determining flip chip connections, the tool comprising:
a computing system having at least the processor that is at least to:
generate a first projection having representations of bumps arranged over a core of the flip chip by at least drawing a line or a line segment through a bump between a location within a first ring of a flip chip and an outer portion of the flip chip, wherein
the representations of the first projection comprise at least one representation of the first ring and at least one representation of a second ring, and
the first ring is an inner ring to and is different from the second ring;
generate a second projection having representations of fixed I/O pads arranged around the core; and
determine connections between bumps and fixed I/O pads based at least in part on representations of respective first and second projections so that no bump—fixed I/O pad connection crosses another bump—fixed I/O pad connection.

12. The tool of claim 11, the computing system that is to determine the connections further is further to determine connections between bumps and fixed I/O pads based at least in part on representations of respective first and second projections so that only one bump is connected to only one fixed I/O pad.

13. The tool of claim 11, wherein the computing system having the processor is further to:
implement the determined connections with a router.

14. The tool of claim 11, all of the determined connections being completed within a single redistribution layer.

15. The tool of claim 11, wherein the computing system having the processor is further to:
assign bump representations to a hierarchy that includes a plurality of levels, at least one bump representation being assigned to a level; and
determine whether any determined bump—fixed I/O pad connection should be adjusted based on the hierarchy.

16. The tool of claim 15, wherein the computing system that is to determine whether any bump—fixed I/O pad connection should be adjusted is further at least to:
in a first projection, identify higher-level bump representations that are located between first and second lower-level bump representations;
determine whether the number of identified higher-level bump representations exceeds a pre-determined number; and
if the number of identified higher-level bump representations exceeds the pre-determined number,
adjust the first projection, and
adjust the determined connections between bumps and fixed I/O pads using the adjusted first projection.

17. The tool of claim 16, wherein the first and second lower-level bump representations are in a same hierarchical level.

18. The tool of claim 16, wherein the computing system that is to adjust the first projection is further to
change a sequence of bump representations in the first projection so that the number of higher level bump representations between the first and second lower level bump representations in the adjusted first projection is less than or equal to the pre-determined number.

19. The tool of claim 16, wherein the computing system that is to adjust the first projection is further to:
    delete one or more bump representations in the first projection so that the number of higher level bump representations between the first and second lower level bump representations in the adjusted first projection is less than or equal to the pre-determined number.

20. An article of manufacture comprising a tangible non-transitory computer readable storage medium having a sequence of instructions stored thereupon which, when executed by at least one processor, causes the at least one processor to perform a method for constraint verification for determining flip chip connections, the method, comprising:
    using at least one computing system having at least one processor to perform a process, the process comprising:
    generating a first projection that includes representations of bumps arranged over a core of the flip chip by at least drawing a line or a line segment through a bump between a location within a first ring of a flip chip and an outer portion of the flip chip, wherein the representations of the first projection comprise at least one representation of the first ring and at least one representation of a second ring, and
        the first ring is an inner ring to and is different from the second ring;
    generating a second projection that includes representations of I/O pads arranged around the core; and
    determining connections between bumps and I/O pads based at least in part on connections between bump and I/O pad representations of respective first and second projections, wherein bumps are assigned to fixed I/O pads.

21. The article of manufacture of claim 20, the process further comprising:
    assigning bump representations to a hierarchy that includes a plurality of levels, at least one bump representation being assigned to a level; and
    determining whether any determined bump—fixed I/O pad connection should be adjusted based on the hierarchy.

22. The article of manufacture of claim 21, determining whether any bump—fixed I/O pad connection should be adjusted comprising:
    in the first projection, identifying higher-level bump representations that are located between first and second lower-level bump representations;
    determining whether the number of identified higher-level bump representations exceeds a pre-determined number; and
    if the number of identified higher-level bump representations exceeds the pre-determined number,
        adjusting the first projection, and
        adjusting the determined connections between bumps and fixed I/O pads using the adjusted first projection.

23. The article of manufacture of claim 22, adjusting the first projection comprising:
    changing a sequence of bump representations in the first projection so that the number of higher level bump representations between the first and second lower level bump representations in the adjusted first projection is less than or equal to the pre-determined number; or
    deleting one or more bump representations in the first projection so that the number of higher level bump representations between the first and second lower level bump representations in the adjusted first projection is less than or equal to the pre-determined number.

\* \* \* \* \*